(12) United States Patent
Shiromoto et al.

(10) Patent No.: US 10,120,030 B2
(45) Date of Patent: Nov. 6, 2018

(54) TRACE DATA RECORDING SYSTEM, TRACE DATA RECORDING SERVER, TRACE DATA RECORDING METHOD, AND INFORMATION STORAGE MEDIUM

(71) Applicant: Kabushiki Kaisha Yaskawa Denki, Kitakyushu-shi (JP)

(72) Inventors: Naoki Shiromoto, Kitakyushu (JP); Toshinobu Kira, Kitakyushu (JP); Tadashi Okubo, Kitakyushu (JP); Ayaka Hashimoto, Kitakyushu (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 229 days.

(21) Appl. No.: 15/140,481

(22) Filed: Apr. 28, 2016

(65) Prior Publication Data

US 2016/0238659 A1    Aug. 18, 2016

Related U.S. Application Data

(63) Continuation of application No. PCT/JP2013/079941, filed on Nov. 5, 2013.

(51) Int. Cl.
*G01R 31/34* (2006.01)
*G06F 11/36* (2006.01)
*H04L 29/08* (2006.01)

(52) U.S. Cl.
CPC .......... *G01R 31/34* (2013.01); *G06F 11/3636* (2013.01); *H04L 67/1097* (2013.01)

(58) Field of Classification Search
CPC .. G01R 31/34; H04L 67/1097; G06F 11/3636
See application file for complete search history.

(56) References Cited

U.S. PATENT DOCUMENTS

2008/0209443 A1   8/2008 Suzuki
2014/0336785 A1*  11/2014 Asenjo ............... G05B 19/4185
                                                    700/17

FOREIGN PATENT DOCUMENTS

| JP | S62-281781 A  | 12/1987 |
|----|---------------|---------|
| JP | 2004-312894 A | 11/2001 |
| JP | 2002-032120 A | 1/2002  |
| JP | 2002-078200 A | 3/2002  |
| JP | 2002-223586 A | 8/2002  |
| JP | 2006-115587 A | 4/2006  |
| JP | 2006-244215 A | 9/2006  |
| JP | 2008-109789 A | 5/2008  |
| JP | 2008-210213 A | 9/2008  |

(Continued)

OTHER PUBLICATIONS

Pineda-Sanchez et al., Motor Condition Monitoring of Induction Motor with Programmable Logic Controller and Industrial Network, 2011, Proceedings of the 2011 14th European Conference on Power Electronics and Applications, 10 pp.*

(Continued)

*Primary Examiner* — Toan Le
(74) *Attorney, Agent, or Firm* — HEA Law PLLC

(57) ABSTRACT

Provided is a trace data recording system, including: a trace data generator configured to generate trace data of equipment relating to motor control; a trace data transmitter configured to transmit the generated trace data to a server via a network; and a trace data recorder configured to record the transmitted trace data in the server.

13 Claims, 9 Drawing Sheets

(56) References Cited

FOREIGN PATENT DOCUMENTS

| JP | 2012-059122 A | 3/2012 |
|----|---------------|--------|
| JP | 2013-089184 A | 5/2013 |
| WO | 2012/150688 A1 | 11/2012 |

OTHER PUBLICATIONS

Abstract of Pineda-Sanchez et al., 2011, IEEE Xplore Search Results, 3 pp.*

* cited by examiner

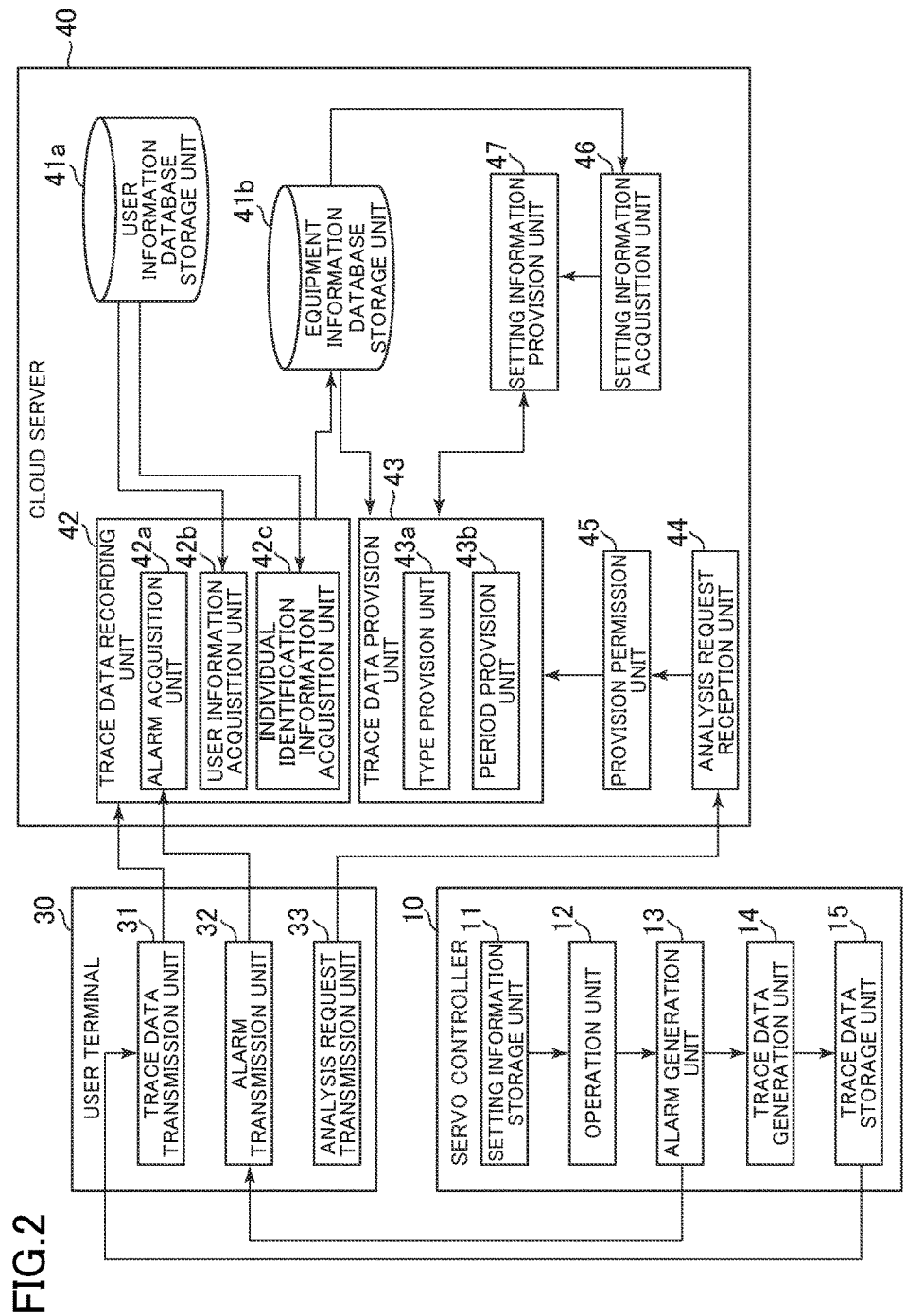

FIG.3

| SERIAL NUMBER | MANUFACTURER AREA ||||||| USER AREA |||||||
| | OWNER | EQUIPMENT NAME | MODEL | EQUIPMENT DESCRIPTION | FIRMWARE | ... | TRACE DATA | ALARM INFORMATION | USER ID | PROVISION PERMISSION FLAG | PARAMETER | FACILITY NAME | EQUIPMENT NAME | APPLICATION |
| --- | --- | --- | --- | --- | --- | --- | --- | --- | --- | --- | --- | --- | --- | --- |
| si0000 | PERSON A | EQUIPMENT NAME A | MODEL A | EQUIPMENT A 100V 100W | FIRMWARE A/VERSION1.0 | ... | TRACE DATA A | ALARM INFORMATION A | u00001 | 1 | PARAMETER A | FACILITY A | NAME A | APPLICATION A |
| si0001 | PERSON B | EQUIPMENT NAME A | MODEL A | EQUIPMENT A 100V 100W | FIRMWARE B/VERSION1.0 | ... | TRACE DATA B | ALARM INFORMATION B | u00001 | 0 | PARAMETER B | FACILITY B | NAME B | APPLICATION B |
| si0002 | COMPANY C | EQUIPMENT NAME A | MODEL A | EQUIPMENT A 100V 100W | FIRMWARE C/VERSION1.0 | ... | TRACE DATA C | ALARM INFORMATION C | u00003 | 1 | PARAMETER C | FACILITY C | NAME C | APPLICATION C |
| si0003 | COMPANY D | EQUIPMENT NAME A | MODEL A | EQUIPMENT A 100V 100W | FIRMWARE D/VERSION1.0 | ... | TRACE DATA D | ALARM INFORMATION D | u00004 | 1 | PARAMETER D | FACILITY D | NAME D | APPLICATION D |
| ... | ... | ... | ... | ... | ... | ... | ... | ... | ... | ... | ... | ... | ... | ... |

FIG.4

| ALARM TYPE | TRACE TARGET |
|---|---|
| ALARM A | TRACE TARGET 1 |
| ALARM B | TRACE TARGET 2 |
| ALARM C | TRACE TARGET 3 |
| ⋮ | ⋮ |

FIG.5

| ALARM TYPE | PERIOD |
|---|---|
| ALARM A | 10 SECONDS BEFORE TO 5 SECONDS BEFORE |
| ALARM B | 2 SECONDS BEFORE AND AFTER GENERATION |
| ALARM C | 3 SECONDS BEFORE TO 1 SECOND AFTER |
| ⋮ | ⋮ |

TRACE DATA RECORDING SYSTEM, TRACE DATA RECORDING SERVER, TRACE DATA RECORDING METHOD, AND INFORMATION STORAGE MEDIUM

INCORPORATION BY REFERENCE

The present disclosure contains subject matter related to that disclosed in International Patent Application PCT/JP2013/079941 filed in the Japan Patent Office on Nov. 5, 2013, the entire contents of which are hereby incorporated by reference.

BACKGROUND OF THE INVENTION

Field of the Invention

The embodiments disclosed herein relate to a trace data recording system, a trace data recording server, a trace data recording method, and an information storage medium.

Description of the Related Art

In Japanese Patent Application Laid-open No. 2008-109789, a technology is described in which trace data is stored in a memory of equipment relating to motor control, and the trace data is verified at the equipment.

SUMMARY OF THE INVENTION

According to one aspect of the present invention, there is provided a trace data recording system, including: a trace data generator configured to generate trace data of equipment relating to motor control; a trace data transmitter configured to transmit the generated trace data to a server via a network; and a trace data recorder configured to record the transmitted trace data in the server.

BRIEF DESCRIPTION OF THE DRAWINGS

FIG. 2 is a functional block diagram for illustrating functions realized by the trace data recording system.

FIG. 3 is a diagram for showing an example of an equipment information database.

FIG. 4 is a diagram for showing an association between an alarm type and a trace target to be provided to an analyst.

FIG. 5 is a diagram for showing an association between the alarm type and a period for providing trace data to the analyst.

DESCRIPTION OF THE EMBODIMENTS

From the perspective of the inventor(s) of the present invention, when a failure or the like has occurred in equipment relating to motor control, in order to analyze the cause of the failure, it may be necessary to request trace data of the equipment from the user. Hitherto, the user has transmitted the trace data to an operator at a call center, and the trace data has been transferred from the operator to the design department at the manufacturer. As a result, handling of user inquiries becomes complex, and there is a fear of a mistake being made in the relevant trace data.

As a result of diligent research and development regarding how to facilitate analysis of the trace data of equipment relating to motor control, the inventor(s) of the present invention has(have) conceived of a novel and creative trace data recording system and the like. This trace data recording system and the like are now described in detail by way of an embodiment thereof.

[Trace Data Recording System According to Embodiment of Present Invention]

Figure 1:
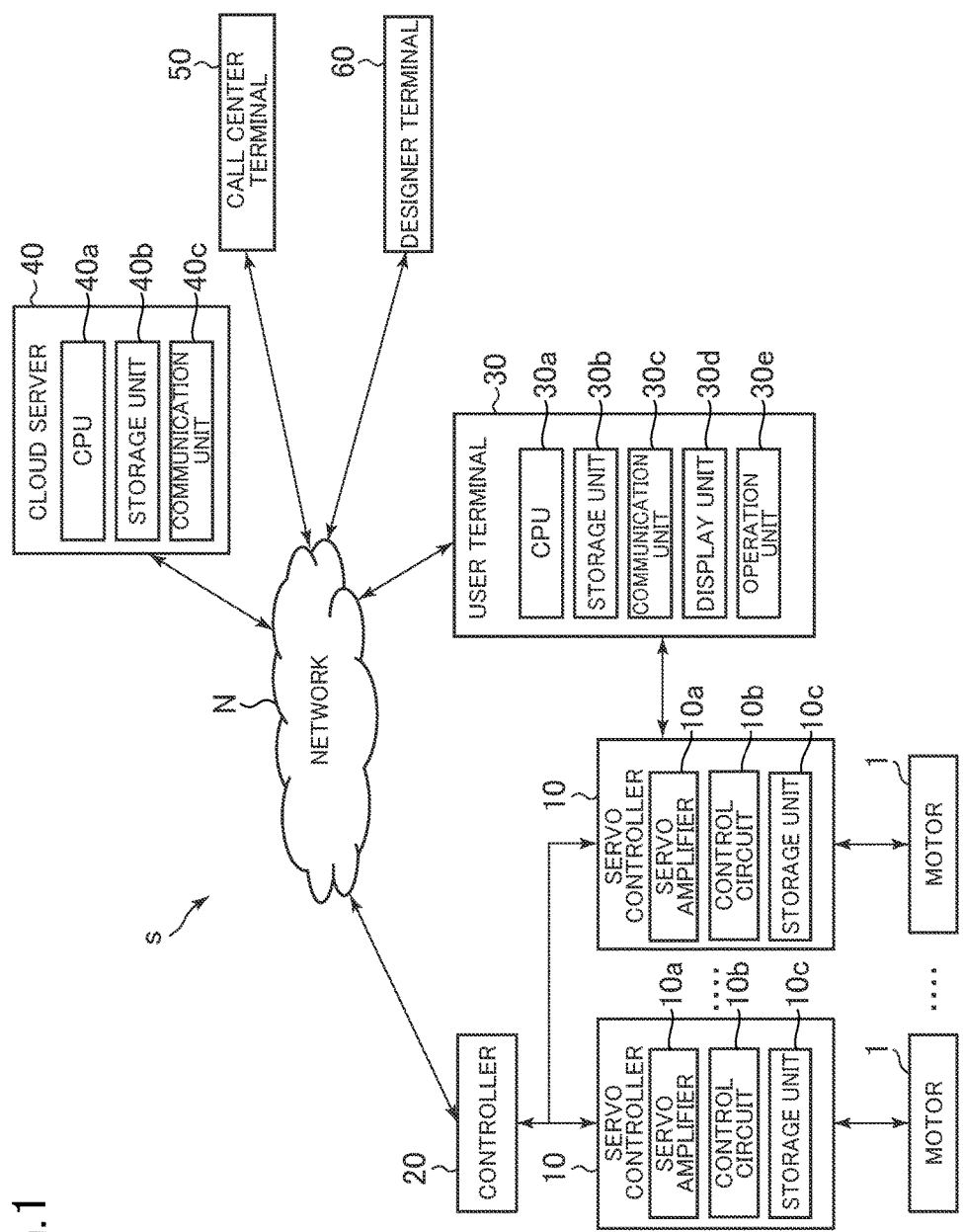
FIG. 1 is a diagram for illustrating an example of an overall configuration of a trace data recording system according to an embodiment of the present invention.

FIG. 1 is a diagram for illustrating an example of an overall configuration of a trace data recording system according to an embodiment of the present invention. As illustrated in FIG. 1, a trace data recording system S includes a plurality of motors 1, a plurality of servo controllers 10, a controller 20, a user terminal 30, a cloud server 40 (trace data recording server), a call center terminal 50, and a designer terminal 60. The controller 20, the user terminal 30, the cloud server 40, the call center terminal 50, and the designer terminal 60 are connected via a network N in a manner that allows data to be transmitted and received to and from each other.

In this embodiment, a case in which the trace data recording system S is utilized by a manufacturer that sells or performs after-sales service of equipment relating to motor control (e.g., controllers and servo controllers), and a user who purchases and uses those equipment, is described as an example. For example, each motor 1, each servo controller 10, the controller 20, and the user terminal 30 are in the possession of the user, and the cloud server 40, the call center terminal 50, and the designer terminal 60 are managed by the manufacturer.

Each servo controller 10 integrally includes a servo amplifier 10a and a control circuit 10b, and is configured to be operated based on commands from the controller 20. A storage unit 10c in each servo controller 10 includes a dynamic random-access memory (DRAM), an electrically erasable programmable read-only memory (EEPROM), or the like, and is configured to store parameters and firmware and the like for operating the servo controller 10. In this embodiment, each servo controller 10 is given a two-dimensional code including a serial number.

The controller 20 is configured to control each servo controller 10 in an integrated manner by outputting to each servo controller 10 higher-level control commands for controlling the motor 1.

The user terminal 30 is a general computer such as a personal computer or a mobile terminal, and includes a CPU 30a, a storage unit 30b, a communication unit 30c, a display unit 30d, and an operation unit 30e. The storage unit 30b includes a DRAM, a hard disk, and the like to store various programs and data. The CPU 30a is configured to execute various types of processing based on those programs and data. The communication unit 30c includes a network card, various communication connectors, and the like to hold communication to and from other devices. The display unit 30d is a liquid crystal display or the like, and is configured to display various screens upon an instruction issued by the CPU 30a. The operation unit 30e is an input device such as a mouse or a keyboard.

The user terminal 30, which is connectable to various types of industrial equipment, is configured to be used by the user for maintenance tasks. In this embodiment, a case in which the user terminal 30 is connected to each servo controller 10 is described as an example. For example, the user terminal 30 is configured to write a parameter specified by the user in the storage unit 10c of each servo controller 10. Further, the user terminal 30 is configured to download from the cloud server 40 firmware selected by the user, and to install the downloaded firmware in the storage unit 10c of each servo controller 10. In addition, the user terminal 30 is configured to update the installed firmware. In this embodiment, the user terminal 30 may also be configured to display on the display unit 30d various types of information registered in the cloud server 40. Still further, the user terminal 30 may include a camera configured to photograph a two-dimensional code of the servo controllers 10. In this case, the user terminal 30 may be configured to analyze an image of the two-dimensional code photographed by the camera to identify a serial number and the like, which is an individual identification number of each servo controller 10.

The cloud server 40 is a server computer configured to manage various types of information used in the trace data recording system S, and includes a CPU 40a, a storage unit 40b, and a communication unit 40c. Those hardware configurations are the same as those of the CPU 30a, the storage unit 30b, and the communication unit 30c, respectively, and hence descriptions thereof are omitted. The cloud server 40 is configured to manage personal information on each user, various types of information on the industrial equipment, and the like, to provide those pieces of information in response to a request from outside and provide firmware handled by the manufacturer to the user.

The call center terminal 50 is a computer configured to be operated by an operator at a call center that receives inquires relating to industrial equipment. The designer terminal 60 is a computer configured to be operated by a designer at the manufacturer.

Programs and pieces of data described as being stored in the respective devices of the trace data recording system S may be stored in information storage media connected to the devices, or may be acquired from external devices via the network N. The hardware configurations of the respective devices of the trace data recording system S are not limited to the example given above, and pieces of common hardware can be used for the devices. The same applies to the devices of the trace data recording system S for which a detailed description on the hardware configuration is omitted for the sake of simplifying the description.

In this embodiment, the user terminal 30 is configured to acquire trace data from each servo controller 10, and transmit the acquired trace data to the cloud server 40. The trace data is registered in the cloud server 40. The trace data may be easily analyzed by allowing the operator at the call center or the designer at the manufacturer that has received the inquiry from the user to refer to the registered trace data. This technology is now described in more detail.

[Functions Realized by Trace Data Recording System]

FIG. 2 is a function block diagram for illustrating functions realized by the trace data recording system S. The functions realized by the servo controller 10, the user terminal 30, and the cloud server 40 are now described.

[Functions Realized by Servo Controller]

Each servo controller 10 includes a setting information storage unit 11, an operation unit 12, an alarm generation unit 13, a trace data generation unit 14, and a trace data storage unit 15. The setting information storage unit 11 and the trace data storage unit 15 are realized mainly by the storage unit 10c. Each of the other functions is realized mainly by the servo amplifier 10a and the control circuit 10b.

The setting information storage unit 11 is configured to store setting information (e.g., parameters and firmware) for operating the servo controller 10. The setting information may be adjusted or selected by the user. For example, the setting information storage unit 11 is configured to store parameters and firmware specified by the user.

The operation unit 12 is configured to operate based on the setting information stored in the setting information storage unit 11. For example, the operation unit 12 is configured to control the motor 1 by executing a command written in the firmware stored in the setting information storage unit 11 based on the parameters stored in the setting information storage unit 11.

The alarm generation unit 13 is configured to generate an alarm based on the operating state of the equipment. For example, an alarm generation condition is set for each type of alarm. The alarm generation unit 13 is configured to refer to internal information on the equipment to determine whether or not a value of that internal information satisfies a generation condition. The alarm generation unit 13 is configured to generate the type of alarm associated with the generation condition determined as having been satisfied. For example, the alarm generation unit 13 is configured to generate an alarm when the value indicated by the internal information, such as a position deviation, a speed deviation, and an electric current deviation, exceeds a threshold. Note that, this is just one example of the method of generating an alarm. Various known methods may be employed as the actual method of generating an alarm by the alarm generation unit 13. The alarm generation unit 13 may also be configured to automatically notify the user terminal 30 of alarm information when an alarm has been generated.

The trace data generation unit 14 is configured to generate trace data of the equipment relating to motor control (e.g., servo controller 10). The trace data is data representing the operating state in time series. For example, the trace data is data representing the internal information on the equipment in time series, such as a position command speed, the position deviation, a positioning completion signal, the speed deviation, and the electric current deviation. In this case, a plurality of trace targets (types of internal information) are determined for each equipment. The trace data generation unit 14 is configured to generate trace data for each of the plurality of those trace targets. Note that, various known methods may be employed as the actual method of generating the trace data by the trace data generation unit 14, and the method of generating the trace data is not limited to the example described above.

The trace data generation unit 14 may also be configured to constantly generate trace data during operation of the equipment. The trace data generation unit 14 is configured to store the generated trace data in a volatile memory (e.g., DRAM) of the trace data storage unit 15, for example. The trace data generation unit 14 may also be configured to overwrite the oldest trace data when there is no longer any free space in the volatile memory.

The trace data generation unit 14 may also be configured to transfer, when an alarm has been generated, trace data stored in the volatile memory to a non-volatile memory (e.g., EEPROM). The trace data to be stored in the non-volatile memory may be a part of the trace data stored in the volatile memory (e.g., the trace data for a period corresponding to a time point at which the alarm was generated), or may be all of the trace data.

Further, the trace data generation unit 14 may also be configured to not generate trace data when an alarm has not been generated, and to automatically generate trace data when an alarm has been generated. For example, the trace data generation unit 14 is configured to generate, based on the internal information for a period corresponding to the time point at which the alarm was generated, the trace data for that period. This period is a predetermined period including the alarm generation time point, or, a predetermined period before and after, but not including, the alarm generation time point.

The trace data storage unit 15 is configured to store the trace data generated by the trace data generation unit 14. As described above, the trace data storage unit 15 may include a volatile storage area and a non-volatile storage area. For example, the trace data storage unit 15 is configured to store trace data for each of the plurality of trace targets. Further, the trace data storage unit 15 is configured to store, in the case of trace data generated when an alarm was generated, the trace data together with the alarm information. The alarm information is information for identifying the generated alarm, and indicates, for example, the type of alarm, and the time point at which the alarm was generated.

[Functions Realized by User Terminal]

The user terminal 30 includes a trace data transmission unit 31, an alarm transmission unit 32, and an analysis request transmission unit 33. Each of those functions is realized mainly by the CPU 30a and the communication unit 30c.

The trace data transmission unit 31 is configured to transmit the trace data generated by the trace data generation unit 14 to the cloud server 40 via the network N. For example, the trace data transmission unit 31 is configured to acquire, when the user has performed a predetermined operation, the trace data stored in the trace data storage unit 15, and to transmit the acquired data to the cloud server 40. In this case, the trace data transmission unit 31 is configured to transmit the trace data together with a user ID of the user and the serial number of the equipment. The user ID may be input by the user, or a user ID stored in the user terminal 30 may be acquired. The serial number of the equipment may be input by the user, or may be stored in the servo controller 10.

The trace data transmission unit 31 may also be configured to automatically transmit, when an alarm has been generated, the trace data generated by the trace data generation unit 14 to the cloud server 40. In this case, the trace data transmission unit 31 is configured to monitor whether or not an alarm has been generated by the alarm generation unit 13, and when it is determined that an alarm has been generated, transmit the trace data to the cloud server 40. For example, the trace data transmission unit 31 may be configured to transmit the trace data when alarm information is received from the alarm generation unit 13.

The alarm transmission unit 32 is configured to transmit information for identifying the type of alarm generated in the equipment to a server. For example, the alarm transmission unit 32 is configured to acquire alarm information from the alarm generation unit 13, and to transmit the acquired information to the cloud server 40.

The analysis request transmission unit 33 is configured to transmit an analysis request to an analyst (e.g., operator at the call center or designer at the manufacturer). The analysis request transmission unit 33 is configured to transmit to the cloud server 40 a signal indicating that the user has performed a predetermined analysis request operation for issuing an analysis request to the analyst.

[Functions Realized by Cloud Server]

The cloud server 40 includes a user information database storage unit 41a, an equipment information database storage unit 41b, a trace data recording unit 42, a trace data provision unit 43, an analysis request reception unit 44, a provision permission unit 45, a setting information acquisition unit 46, and a setting information provision unit 47. The user information database storage unit 41a and the equipment information database storage unit 41b are realized mainly by the storage unit 40b. Each of the other functions is realized mainly by the CPU 40a.

[Each Database Storage Unit]

The user information database storage unit 41a is configured to store a user information database for storing various types of information on the user. For example, the user information database is configured to store a user ID for uniquely identifying a user and personal information on each user (e.g., name and contact details). When the user performs a predetermined user registration, a new record is created in the user information database, and the information input by the user who has performed the user registration is stored in the record. The information stored in the user information database may be changed in accordance with each user's operation.

The equipment information database storage unit 41b is configured to store an equipment information database for storing various types of information on the industrial equipment. FIG. 3 is a diagram for showing an example of the equipment information database. As shown in FIG. 3, the equipment information database stores the serial number serving as individual identification information on the equipment, an owner thereof, and equipment information. The equipment information includes a manufacturer area serving as a data area managed by the manufacturer and a user area serving as a data area managed by each user.

The manufacturer area stores information unique to the industrial equipment, and stores, for example, various types of information (e.g., industrial equipment name, model, and industrial equipment description relating to the specifications) for identifying the industrial equipment, type and version information on firmware, and the like. The type and version information on the firmware within the manufacturer area are appropriately changed when the firmware is downloaded or updated. Meanwhile, the other information is not updated because of not being changed in principle after the industrial equipment is purchased.

In the user area, equipment information input by the user is stored. For example, trace data uploaded by the user, setting information adjusted by the user (e.g., parameters), various information relating to the equipment (e.g., a name of the facility where the equipment is to be used, a name given by the user, and an application the equipment is to be used for) are stored.

The trace data is associated with the alarm information corresponding to that trace data, the user ID under which that trace data was uploaded, and a provision permission flag. The provision permission flag, which is a flag indicating whether or not the trace data is to be provided to the analyst, is a value (e.g., "1") indicating that it is permitted for the trace data to be provided to the analyst, or a value (e.g., "0") indicating that it is prohibited for the trace data to be provided to the analyst.

Alarm information is not stored when the trace data uploaded by the user is not trace data generated when an alarm was generated. Because the trace data recording unit 42 is configured to store trace data in the equipment information database each time trace data is acquired, a history of the trace data is stored in the user area. For example, a generation time point of the data may be included in the trace data in order to enable a time series within that history to be identified. Further, the user area may be configured so that the actual data of the trace data or the parameters is stored, or so that only a file name and storage location of the trace data and the parameters are stored, with the actual data of the file being stored in another storage area. In addition, the user area may be configured so that each item input to the user area is freely editable by each user.

[Trace Data Recording Unit]

The trace data recording unit 42 is configured to record the trace data transmitted by the trace data transmission unit 31 in the cloud server 40. For example, the trace data recording unit 42 is configured to store the trace data in the user area of the equipment information database.

In this embodiment, the trace data recording unit 42 includes an alarm acquisition unit 42a configured to acquire the type of alarm (e.g., alarm information) transmitted by an alarm data transmission unit. In this case, the trace data recording unit 42 links the trace data transmitted by the trace data transmission unit 31 with the type of generated alarm, and records the linked trace data in the cloud server 40. More specifically, because the trace data indicates the operating state when the alarm was generated, the trace data recording unit 42 is configured to link the trace data with the type of generated alarm, and record the trace data generated when that type of alarm was generated. In this embodiment, associating pieces of data with each other (e.g., storing in the same record) is equivalent to linking.

Further, in this embodiment, the trace data recording unit 42 includes a user information acquisition unit 42b configured to acquire user information for identifying the user (e.g., user ID). In this case, the trace data recording unit 42 is configured to link the trace data transmitted by the trace data transmission unit 31 with the acquired user information, and record the linked trace data. For example, the trace data recording unit 42 is configured to link the received trace data with the user ID of the user terminal 30 that has transmitted the trace data, and store the linked trace data in the equipment information database.

In addition, in this embodiment, the trace data recording unit 42 includes an individual identification information acquisition unit 42c configured to acquire individual identification information on the equipment (e.g., serial number). In this case, the trace data recording unit 42 is configured to link the trace data transmitted by the trace data transmission unit 31 with the acquired individual identification information, and record the linked trace data. For example, the trace data recording unit 42 is configured to link the received trace data with the serial number of the equipment indicated by the trace data, and store the linked trace data in the equipment information database.

[Trace Data Provision Unit]

The trace data provision unit 43 is configured to provide the trace data to the analyst. In this case, transmitting the trace data to the terminal (e.g., call center terminal 50 or designer terminal 60) operated by the analyst is equivalent to providing the trace data. In other words, permitting access to the trace data is equivalent to providing the trace data.

In this embodiment, the trace data provision unit 43 includes a type provision unit 43a and a period provision unit 43b.

The type provision unit 43a is configured to provide to the analyst, among the plurality of trace targets relating to the equipment, the trace data of the trace target corresponding to the type of the generated alarm. FIG. 4 is a diagram for showing an association between the alarm type and the trace target to be provided to the analyst. The type provision unit 43a is configured to provide to the analyst, among the plurality of types of trace targets capable of being detected by the equipment, the trace data of the trace target associated with the alarm type. In other words, the type provision unit 43a differentiates the trace target to be provided to the analyst based on the type of generated alarm.

The period provision unit 43b is configured to provide to the analyst the trace data for the period corresponding to the type of generated alarm. FIG. 5 is a diagram for showing an association between the alarm type and the period for providing the trace data to the analyst. This period is a period determined based on an alarm generation time point, and is, for example, a predetermined period including the alarm generation time point, or, a predetermined period before and after, but not including, the alarm generation time point. The period provision unit 43b is configured to provide to the analyst, among the periods that the equipment has been operating, trace data representing the internal information on the period associated with the alarm type. In other words, the period provision unit 43b differentiates the period indicated by the trace data to be provided to the analyst based on the type of generated alarm. The data indicating the associations shown in FIG. 4 and FIG. 5 is stored in the cloud server 40.

[Analysis Request Reception Unit]

The analysis request reception unit 44 is configured to receive an analysis request to the analyst. The analysis request reception unit 44 is configured to receive a signal indicating that the user has performed an analysis request operation. For example, the analysis request reception unit 44 is configured to receive an analysis request for each piece of trace data.

[Provision Permission Unit]

The provision permission unit 45 is configured to permit, when an analysis request has been received, trace data registered in the cloud server 40 to be provided to the analyst. For example, the provision permission unit 45 is configured to provide to the analyst, among the trace data registered in the equipment information database, the trace data for which an analysis request has been issued. In other words, the provision permission unit 45 is configured to prohibit provision to the analyst of, among the trace data registered in the equipment information database, trace data for which an analysis request has not been issued. In this case, the provision permission unit 45 changes the value of the provision permission flag of the trace data for which the analysis request has been received.

[Setting Information Acquisition Unit]

The setting information acquisition unit 46 is configured to acquire setting information on equipment. For example, the setting information acquisition unit 46 is configured to acquire from the equipment information database setting information on the equipment indicated by the trace data. The setting information acquisition unit 46 may also be configured to directly acquire setting information from the setting information storage unit 11.

[Setting Information Provision Unit]

The setting information provision unit 47 is configured to provide to the analyst the setting information acquired by the setting information acquisition unit 46 together with the trace data registered in the cloud server 40. In this case, displaying the setting information on the terminal (e.g., call center terminal 50 or designer terminal 60) operated by the analyst is equivalent to providing the setting information. For example, the setting information provision unit 47 is configured to display the setting information on the equipment indicated by the trace data on the same screen as the screen on which the trace data is displayed.

[Processing Executed by Trace Data Recording System]

Figure 6:
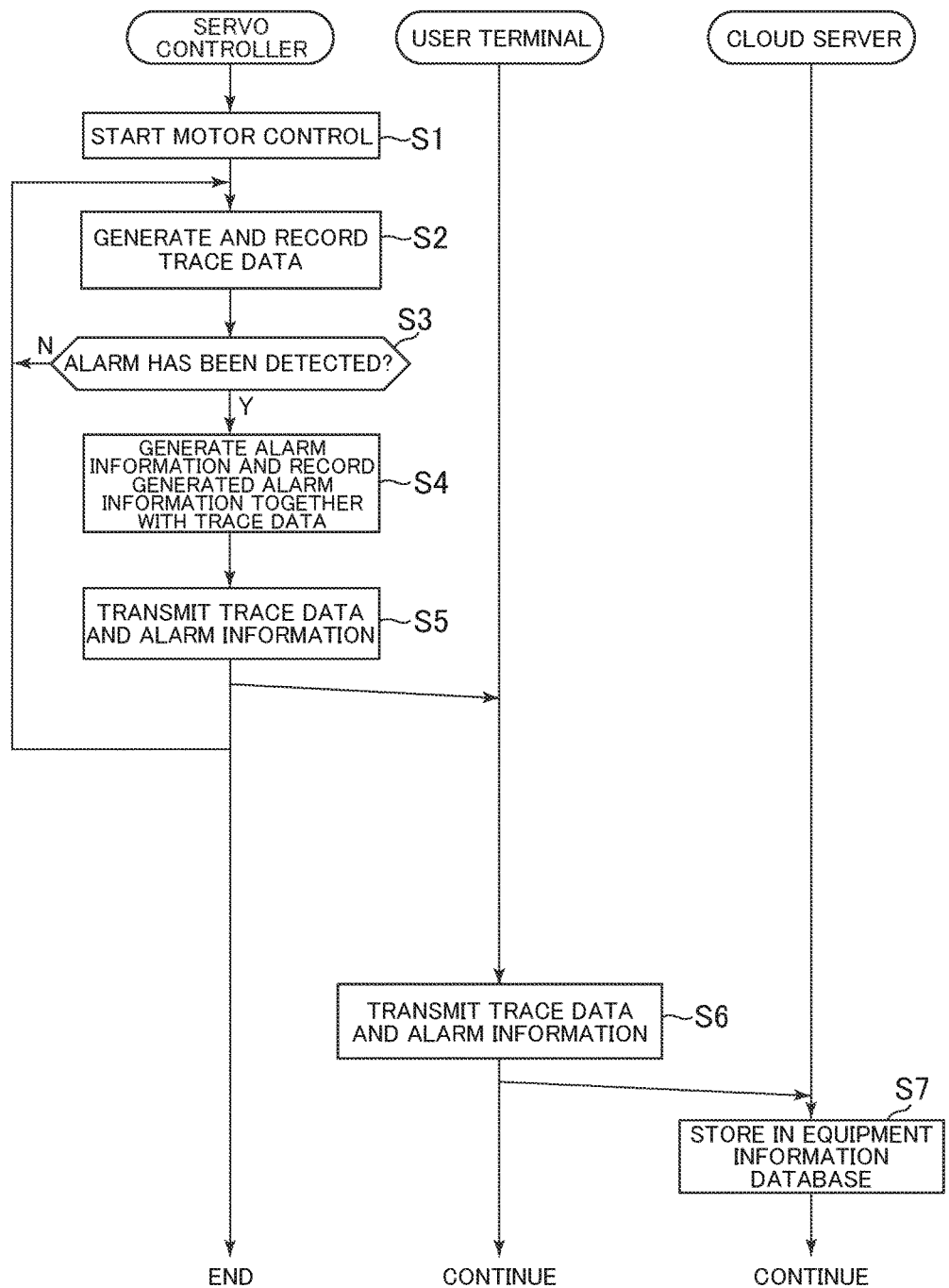
FIG. 6 is a diagram for illustrating an example of processing executed by the trace data recording system.
Figure 7:
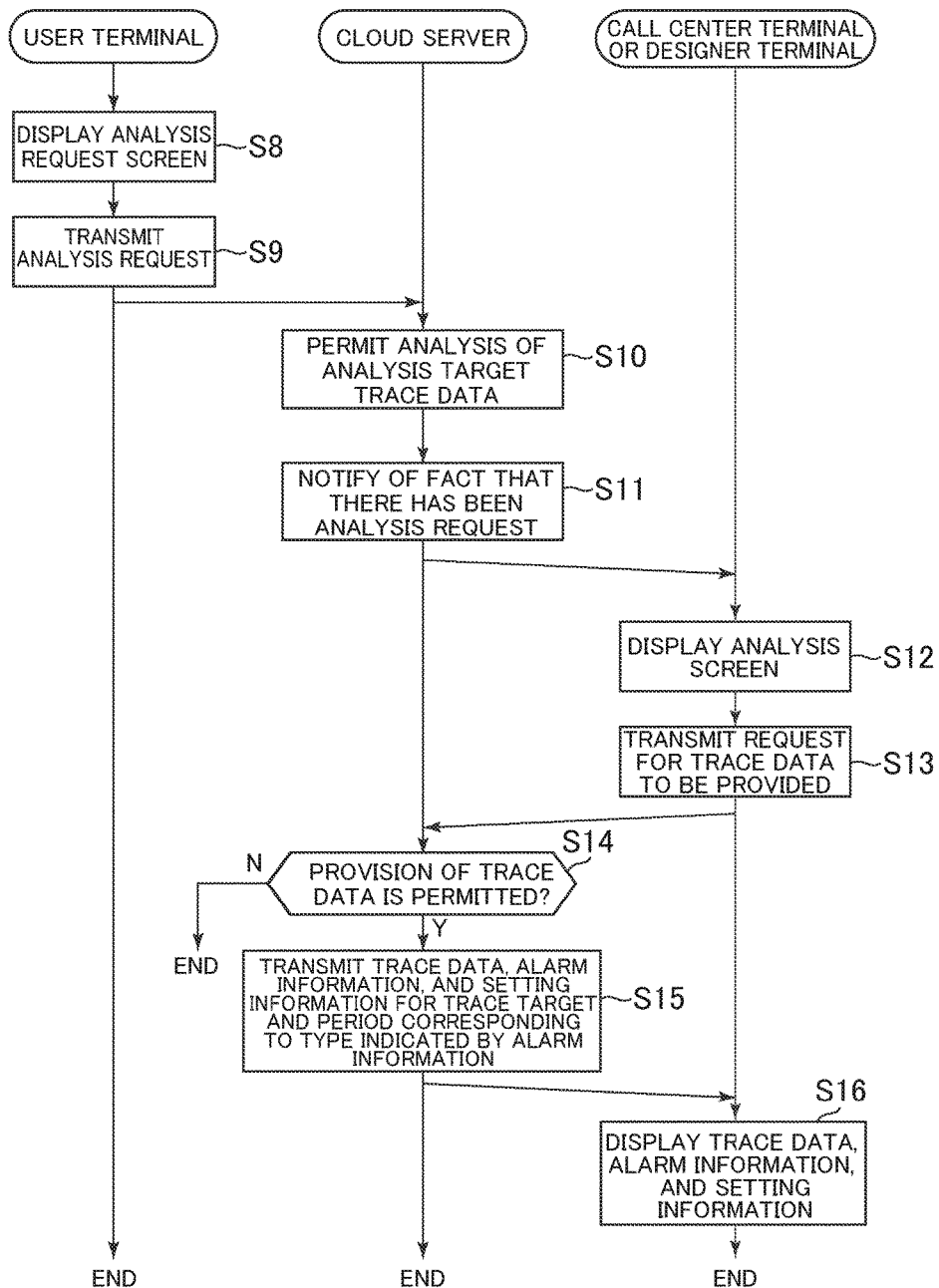
FIG. 7 is a diagram for illustrating an example of processing executed by the trace data recording system.

FIG. 6 and FIG. 7 are diagrams for illustrating an example of processing executed by the trace data recording system S. Each function block is realized through the execution of the processes described below. First, as illustrated in FIG. 6, the servo controller 10 starts control of the motor 1 based on an instruction from the controller 20 and the setting information stored in the storage unit 10c (S1). At the servo controller 10, when control of the motor 1 starts, internal information accumulates in the storage unit 10c.

The servo controller 10 generates the trace data based on the internal information stored in the storage unit 10c, and records the generated trace data in the storage unit 10c (S2). In Step S2, for example, the servo controller 10 stores the trace data in a volatile memory (e.g., DRAM) of the storage unit 10c.

The servo controller 10 determines whether or not an alarm has been detected (S3). In Step S3, the servo controller 10 determines whether or not a value indicated by the internal information satisfies a generation condition. In other words, the servo controller 10 determines whether or not the current operating state matches a predetermined condition.

When it is determined that an alarm has been detected (S3: Y), the servo controller 10 generates alarm information (e.g., alarm type and generation time point), and records the generated alarm information together with the trace data in the storage unit 10c (S4). In Step S4, the servo controller 10 generates the alarm information by identifying the alarm type based on the generation condition satisfied by the internal information. For example, the servo controller 10 transfers the trace data stored in the volatile memory of the storage unit 10c to a non-volatile memory (e.g., EEPROM), and stores the trace data in the non-volatile memory together with the alarm information.

The servo controller 10 transmits the trace data and the alarm information to the user terminal 30 (S5). In Step S5, for example, the servo controller 10 transmits the trace data and the alarm information stored in the non-volatile memory of the storage unit 10c to the user terminal 30. The servo controller 10 may also be configured to transmit its own serial number (which is stored in advance in the storage unit 10c).

When the trace data and the alarm information have been received at the user terminal 30, the CPU 30a transmits the trace data and the alarm information to the cloud server 40 (S6). In Step S6, the CPU 30a also transmits the equipment serial number and the user ID of the user (which may be stored in advance in the storage unit 30b, or may be input from the operation unit 30e).

When the trace data, the alarm information, and the like have been received at the cloud server 40, the CPU 40a stores the received trace data, alarm information, and the like in the equipment information database (S7). In Step S7, the CPU 40a stores the trace data, the user ID of the user who uploaded the trace data, and the alarm information in, of the equipment information database, the user area of the record matching the serial number of the equipment of the received trace data. As the initial value of the provision permission flag, a value indicating "prohibited" is stored.

The processing described above is then repeated until control of the motor 1 by the servo controller 10 is finished. In other words, trace data and alarm information are uploaded to the cloud server 40 each time an alarm is generated.

Next, in FIG. 7, at the user terminal 30, the CPU 30a displays on the display unit 30d an analysis request screen for asking the analyst to analyze the uploaded trace data (S8).

Figure 8:
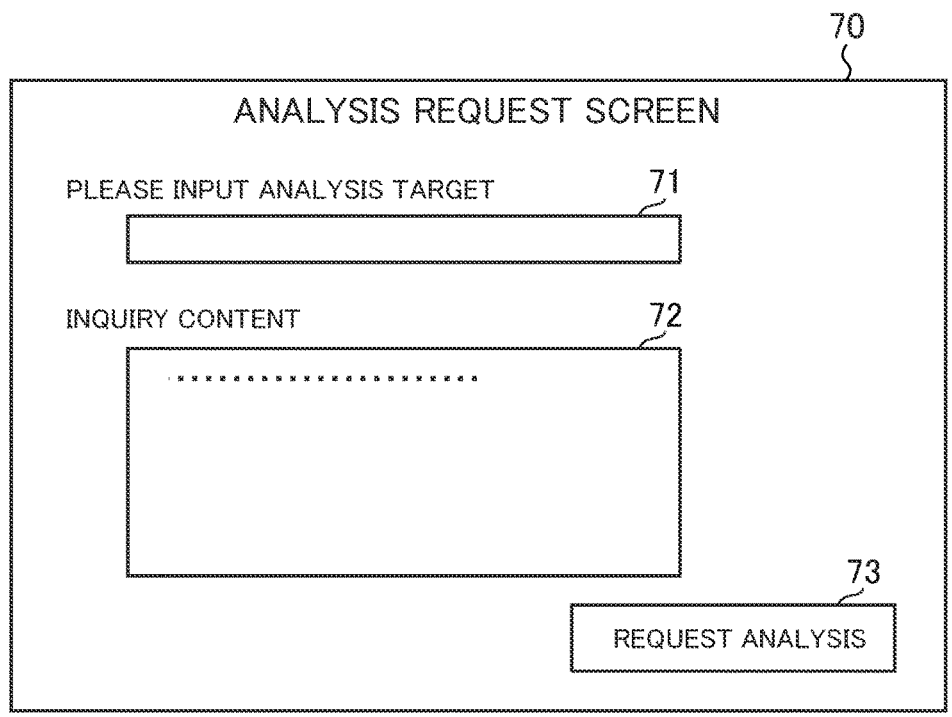
FIG. 8 is a diagram for illustrating an example of an analysis request screen.

FIG. 8 is a diagram for illustrating an example of the analysis request screen. As illustrated in FIG. 8, an input form 71 for specifying the analysis target trace data, an input form 72 for inputting inquiry content, and an analysis request button 73 for transmitting an analysis request are displayed on an analysis request screen 70. The user inputs information for identifying the trace data in the input form 71. For example, the user inputs the serial number of the equipment and the user ID in the input form 71. The analysis request screen 70 may also be configured so that a list of the trace data stored in the user area of the equipment information database is displayed on the analysis request screen 70, and the user selects the analysis target trace data from within the list.

When the analysis request button 73 is selected, the CPU 30a transmits an analysis request to the cloud server 40 (S9). In Step S9, the CPU 30a also transmits information (e.g., serial number and user ID) for identifying the trace data specified as the analysis target, and the inquiry content.

When the analysis request is received at the cloud server 40, the CPU 40a permits analysis of the analysis target trace data (S10). In Step S10, the CPU 40a changes the value of an analysis permission flag of the analysis target trace data to "permitted".

The CPU 40a notifies the call center terminal 50 or the designer terminal 60 of the fact that there has been an analysis request (S11). In Step S11, the CPU 40a refers to the user information database and the equipment information database, and notifies the call center terminal 50 or the designer terminal 60 of information for identifying the user who made the analysis request (e.g., user ID, name, contact details, etc.), the analysis target trace data, information relating to the equipment to be analyzed, the inquiry content input by the user, and the like, by using a predetermined notification medium (e.g., e-mail).

Figure 9:
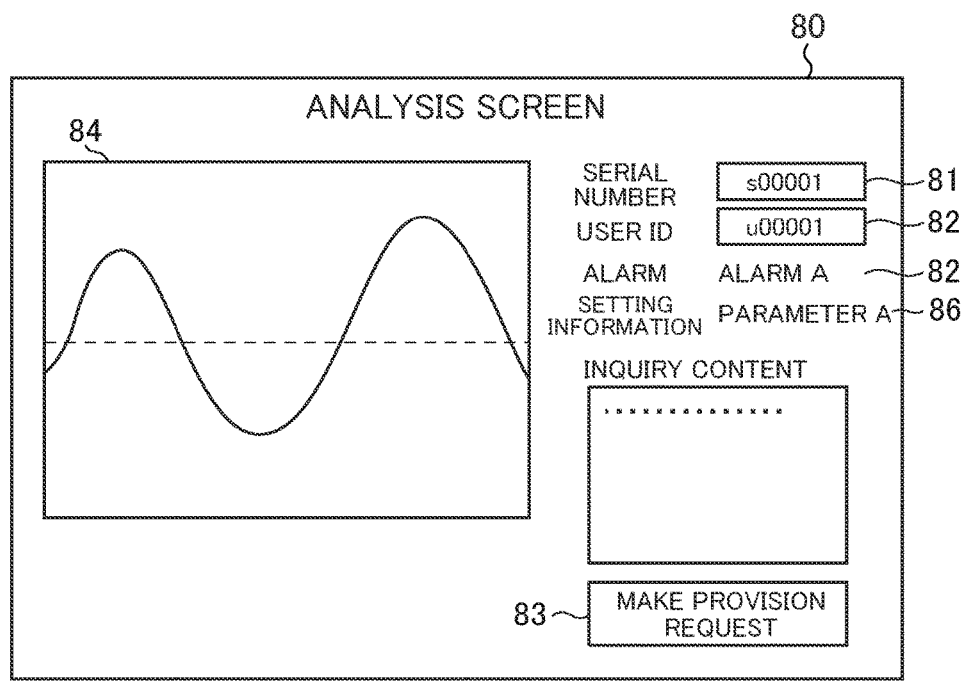
FIG. 9 is a diagram for illustrating an example of an analysis screen.

The call center terminal 50 or the designer terminal 60 displays an analysis screen that the analyst uses to perform analysis (S12). FIG. 9 is a diagram for illustrating an example of the analysis screen. As illustrated in FIG. 9, an input form 81 that the analyst uses to input the serial number of the equipment to be analyzed, an input form 82 for inputting the user ID of the user who made the inquiry, and a provision request button 83 for requesting that the trace data be provided are displayed on an analysis screen 80.

When the provision request button 83 is selected, the call center terminal 50 or the designer terminal 60 transmits to the cloud server 40 a request for the trace data to be provided (S13). In Step S13, the call center terminal 50 or the designer terminal 60 also transmits the serial number and the user ID input in the input forms 81 and 82.

At the cloud server 40, the CPU 40a determines whether or not to permit the trace data for which a provision request has been received to be provided (S14). In Step S14, the CPU 40a refers to, within the equipment information database, the analysis permission flag of the trace data having the serial number and user ID specified by the analyst.

When it is determined that the analysis permission flag indicates prohibition (S14: N), the CPU 40a finishes the processing. In this case, because provision of the trace data requested by the analyst is not permitted, the trace data is not transmitted to the call center terminal 50 or the designer terminal 60.

On the other hand, when it is determined that the analysis permission flag indicates permission (S14: Y), the CPU 40*a* transmits to the call center terminal 50 or the designer terminal 60 the trace data, the alarm information, and the setting information for the trace target and period corresponding to the type indicated by the alarm information (S15). In Step S15, the CPU 40*a* refers to, within the equipment information database, the trace data associated with the user ID and serial number specified by the analyst. Further, the CPU 40*a* transmits, of this trace data, the trace data of the trace target and period associated with the type indicated by the alarm information. In addition, the CPU 40*a* also transmits that alarm information, and the setting information (e.g., parameters) on the equipment.

At the call center terminal 50 or the designer terminal 60, the received trace data, alarm information, and setting information are displayed on the analysis screen 80 (S16). In Step S16, the received trace data is displayed in a trace data display area 84 of the analysis screen 80, the received alarm information is displayed in an alarm information display area 85 of the analysis screen 80, and the received setting information is displayed in a setting information display area 86 of the analysis screen 80. The analyst responds to the inquiry from the user while referring to those pieces of data and information.

In the trace data recording system S described above, because the trace data can be uploaded and registered in the cloud server 40, the trace data of the equipment relating to motor control can be analyzed more easily. For example, because the trace data contains a large amount of information, and, various types of information need to be extracted for scrutiny by an expert, uploading the trace data to the cloud server 40 enables analysis and the like to be performed via remote access. Further, a history of the trace data of the equipment may be accumulated by accumulating a large amount of the trace data in the cloud server 40. This allows the life of the equipment and the state of changes over time in the equipment to be analyzed. In addition, trace data of a plurality of equipment may also be accumulated. As a result, not only can the trace data of a given single equipment be analyzed, but the trace data of another equipment related to that equipment can also be analyzed in a cross-sectional manner. This also allows problems to be dealt with at an early stage.

Further, because trace data can be automatically generated when an alarm has been generated, the trace data that is particularly important in order to analyze the cause of alarm generation can be generated. For example, in a case in which trace data is constantly generated, and all of the generated trace data is uploaded, there may be an increased amount of trace data accumulated in the cloud server 40. However, because the trace data is automatically generated when an alarm has been generated, the trace data having a higher level of importance can be preferentially uploaded. As a result, not only can the data amount be reduced, but because the trace data having a higher level of importance is provided, analysis can be performed more efficiently.

In addition, because the analyst can verify the alarm information together with the trace data, analysis can be performed in more detail. For example, because the analysis needs to be based on the type of alarm generated in the equipment, verifying the alarm information together with the trace data enables the analyst to perform analysis effectively, which in turn allows problems to be dealt with at an early stage.

Further, because the trace data can be automatically uploaded when an alarm has been generated, tasks involved with uploading can be omitted. In addition, when the user specifies the trace data to be uploaded, human error, such as making a mistake in the trace data to be uploaded, may occur. However, automatically uploading the trace data when an alarm has been generated enables such errors to be prevented, and allows a rapid response to a failure.

In addition, because analysis of the trace target can be performed based on the type of generated alarm, analysis can be efficiently performed by the analyst. For example, when the trace data for all the trace targets is provided, although this is useful in order for the analyst to perform analysis from various standpoints, on the other hand, this also means that extra work is required in order to search for the trace target that the analyst wants to see. Thus, providing only the trace target matching the alarm type to the analyst removes the need to search for the trace target, hence allowing a rapid response to a failure.

Further, because a trace for a time band corresponding to the type of generated alarm can be picked out and analyzed, the analyst can perform analysis efficiently. For example, when the trace data for all time bands during which the equipment is operating is provided, although this is useful in order for the analyst to perform analysis from various standpoints, this also means that extra work is required in order to search for the portion necessary for analysis of alarm generation. Thus, providing only the period that matches the alarm type to the analyst removes the need to search for the necessary portion, hence allowing a rapid response to a failure.

In addition, configuring so that trace data is not disclosed to the analyst until analysis of the trace data has been requested enables provision of only the trace data that the user wants the analyst to analyze. For example, even if a third party with malicious intent has accessed the equipment information database, because that third party cannot access the trace data unless the provision permission flag indicates permission, unauthorized disclosure of trace data that is not the analysis target (e.g., trace data uploaded for backup purposes) among the uploaded trace data can be prevented.

Further, because the trace data can be managed for each user, the analyst can analyze the trace data on an individual user basis, which facilitates the identification of factors particular to a user. For example, when the user is using the equipment in a given particular usage environment, because there is a possibility that a failure particular to that usage environment occurs, analyzing the trace data on an individual user basis enables the analyst to identify factors particular to that user, and hence to rapidly respond to a failure.

In addition, because the trace data can be managed for each serial number, the analyst can identify factors particular to equipment more easily. For example, when analyzing a failure that has occurred in a given specific equipment, because the analyst can analyze the history of the trace data of that equipment, the analyst can perform a more accurate analysis.

Further, because setting information, such as parameters, can be analyzed together with the trace data, analysis can be performed more efficiently. In particular, registering the setting information in the equipment information database enables the setting information on each equipment to be managed collectively together with the trace data, which allows the analyst to identify whether or not the failure occurred based on specific identified setting information.

Modified Examples

In the embodiment, a case in which the trace data is automatically uploaded when an alarm has been generated is described as an example. However, it is not necessary for all of the trace data to be automatically uploaded. More specifically, at the user terminal 30, a screen asking the user for upload permission may be displayed, and when the user has given permission by performing a predetermined operation, the trace data may be uploaded. In this case, only a portion of the trace data of all the trace data may be uploaded.

Further, the timing at which the trace data is uploaded is not limited to the example described above. For example, the trace data transmission unit 31 may be configured to transmit the trace data to a server when an analysis request is transmitted. The trace data transmission unit 31 is configured to transmit the trace data to the cloud server 40 after the operation for requesting analysis has been performed by the user (e.g., after the analysis request button 73 has been selected). In this case, after the analysis request button 73 has been selected, the input form 72 for inputting the inquiry content may be displayed, and the trace data may be uploaded at that timing.

Configuring in this manner allows trace data to be uploaded at a timing at which an analysis request for the trace data is made. This allows only the trace data determined as being necessary for analysis to be uploaded. As a result, trace data that is not necessary can be prevented from being uploaded. Further, because the analysis request and trace data uploading can be performed in one series of operations, the workload on the user can be reduced efficiently.

In addition to cases in which analysis of the trace data has been requested, the user may also upload the trace data at an arbitrary timing. For example, in addition to cases in which an alarm has been generated, the user may upload trace data to the cloud server 40 and store a backup in the equipment information database by operating the user terminal 30 to acquire the trace data from the storage unit 10*c* of the servo controller 10.

Further, a case is described in which the trace data of all the trace targets is uploaded, and the cloud server 40 selects the necessary trace data at the stage of providing the trace data to the analyst. However, this selection may also be performed at the user terminal 30. For example, only the trace data of the trace target and period corresponding to the type of generated alarm may be uploaded. In addition, the servo controller 10 may be configured to generate only the trace data of the trace target and period corresponding to the type of generated alarm.

In addition, in the embodiment, a case is described in which the trace data is transferred to a non-volatile memory in the servo controller 10 when an alarm has been generated. However, the trace data may be transferred to a non-volatile memory (e.g., EEPROM) in the controller 20. In this case, the trace data may be uploaded from the controller 20 via the user terminal 30, or the trace data may be directly uploaded from the controller 20 to the cloud server 40.

Further, the equipment uploading the trace data to the cloud server 40 may be any equipment as long as the equipment is capable of connecting to the network N. For example, when the servo controller 10 is capable of connecting to the network N, the trace data may be transmitted without being transmitted via the user terminal 30. In addition, when various types of data are transmitted and received between equipment capable of connecting to the network N (e.g., controller 20) and the cloud server 40, a File Transfer Protocol (TFP) may be used as the communication protocol, although there are various other communication protocols that may also be employed. In this case, the equipment may be configured to fulfill the function of the FTP client, and the cloud server 40 may be configured to fulfill the function of the FTP server, or the functions fulfilled by those units may be reversed. By configuring in such a manner, the trace data may be transferred at an arbitrary timing.

In addition, in the embodiment, a case is described in which each servo controller 10 is configured to generate its own trace data. However, the equipment generating the trace data is not limited to a servo controller 10. The trace data of each servo controller 10 may be generated by the controller 20. In this case, the controller 20 is configured to acquire the internal information on each servo controller 10, and generate trace data for each of the plurality of trace targets.

Further, in this embodiment, a case is described in which the trace data of the servo controller 10 as an example of the equipment relating to motor control is uploaded. However, the equipment relating to motor control is not limited to the servo controller 10, and for example, the trace data of the controller 20 may be uploaded. Other examples of trace data that may be uploaded to the cloud server 40 include the trace data of the motor 1, the trace data of an encoder configured to detect the position of the motor 1, and the trace data of an input/output (I/O) unit connected to each equipment.

In addition, a case is described above in which an operator at the call center or a designer at the manufacturer is described as an example of the analyst. However, the analyst may be any person who analyzes the trace data. For example, when the user himself/herself analyzes the trace data uploaded to the cloud server 40, the user is the analyst.

Further, the serial number of the equipment for which trace data is to be uploaded may be acquired by a method determined in advance, or may be input by the user using the operation unit 30*e*, or may be acquired by photographing the two-dimensional code of the servo controller 10 by the user terminal 30. Another example of a method of acquiring the serial number is to include information indicating the serial number of equipment in firmware for operating the equipment or in a separate storage section (e.g., externally connected memory), and refer to that information.

In addition, in the embodiment, a case is described in which uploading is performed by associating the trace data with the serial number of the equipment, the user ID, and the like. However, the serial number of the equipment, the user ID, and the like may be included in the trace data. In other words, data indicating the serial number of the equipment, the user ID, and the like may be integrated with the trace data. Still further, the setting information stored in the storage unit 10*c* may also be included in the trace data.

Further, the data stored in the equipment information database is not limited to the examples described above. For example, when an encoder configured to detect a rotational position of the motor 1 is connected to each servo controller 10, each servo controller 10 operates based on motor information stored in a memory of the encoder, but when an encoder is not employed, the motor information may be stored in the equipment information database. In this case, the motor information may be provided to the analyst together with the trace data. Configuring in such a manner enables the information on the motor 1 to be reliably identified even when there is no encoder, and enables the analyst to perform analysis while referring to the motor information.

Further, the embodiment described above is given as a specific example, and is not to limit the invention disclosed herein to the very configuration and data storage examples of the specific example. A person skilled in the art may make various modifications to the disclosed embodiment with regard to, for example, the shapes and numbers of physical components, data structures, and execution orders of processing. It is to be understood that the technical scope of the invention disclosed herein encompasses such modifications.

In other words, it should be understood by those skilled in the art that various modifications, combinations, sub-combinations and alterations may occur depending on design requirements and other factors insofar as they are within the scope of the appended claims or equivalents thereof.

What is claimed is:

1. A trace data recording system, comprising:
  a motor controller configured to control at least one motor;
  a user terminal operated by a user;
  an analyst terminal operated by an analyst; and
  a cloud server configured to manage information of users;
  wherein the motor controller is configured to generate trace data relating to motor control of the at least one motor;
  wherein the user terminal is configured to transmit the generated trace data to the cloud server via a network when the user performs an upload operation; and
  wherein the cloud server is configured to:
  record the transmitted trace data associated with a serial number of the motor controller and user information of the user who performs the upload operation in the cloud server;
  prohibit the analyst from accessing to the trace data;
    receive an analysis requirement of the trace data with the serial number and the user information from the user terminal; and
    permit the analyst to access to the trace data that is associated with the received serial number and the user information when the analysis requirement is received.

2. The trace data recording system according to claim 1,
  wherein the motor controller is configured to generate an alarm based on an operating state of the motor controller, and
  wherein the motor controller automatically generates the trace data of the motor controller in a case where an alarm has been generated.

3. The trace data recording system according to claim 2,
  wherein the user terminal is configured to transmit to the cloud server information identifying a type of generated alarm,
  wherein the cloud server is configured to acquire the transmitted alarm type, and
  wherein the cloud server links the transmitted trace data with the type of generated alarm, and records the linked trace data in the cloud server.

4. The trace data recording system according to claim 2, wherein the cloud server automatically transmits, in a case where an alarm has been generated, the generated trace data to the server.

5. The trace data recording system according to claim 2,
  wherein the cloud server is configured to transmit to the analyst terminal, among a plurality of trace targets relating to the motor controller, trace data of a trace target corresponding to a type of generated alarm.

6. The trace data recording system according to claim 2,
  wherein the cloud server is configured to transmit to an analyst's terminal trace data for a period corresponding to a type of generated alarm.

7. The trace data recording system according to claim 1,
  wherein the user terminal transmits, in a case where the analysis request is transmitted, the trace data to the cloud server.

8. The trace data recording system according to claim 1,
  wherein the cloud server is configured to acquire user information for identifying a user, and
  wherein the cloud server links the transmitted trace data with the acquired user information, and records the linked trace data.

9. The trace data recording system according to claim 1,
  wherein the cloud server is configured to acquire individual identification information on the motor controller, and
  wherein the cloud server links the transmitted trace data with the acquired individual identification information, and records the linked trace data.

10. The trace data recording system according to claim 1,
  wherein the motor controller operates based on setting information, and
  wherein the cloud server is configured to acquire the setting information on the motor controller; and
    the cloud server is configured to transmit to the analyst terminal the acquired setting information together with the trace data registered in the cloud server.

11. A trace data recording server configured to:
  acquire, from a user terminal configured to transmit trace data relating to motor control of at least one motor that is controlled by a motor controller to the trace data recording server, the trace data via a network;
  record the acquired trace data associated with a serial number of the motor controller and user information of a user who performs an upload operation in the trace data recording server;
  prohibit an analyst who operates an analyst terminal from accessing to the trace data;
  receive an analysis requirement of the trace data with the serial number and the user information from the user terminal; and
  permit the analyst to access to the trace data that is associated with the received serial number and the user information when the analysis requirement is received.

12. A trace data recording method, comprising:
  generating trace data relating to motor control of at least one motor that is controlled by a motor controller;
  transmitting the generated trace data to a cloud server via a network when a user performs an upload operation;
  recording the transmitted trace data associated with a serial number of the motor controller and user information of the user who performs the unload operation in the cloud server;
  prohibiting an analyst who operates an analyst terminal from accessing to the trace data;
  receiving an analysis requirement of the trace data with the serial number and the user information from the user terminal; and
  permitting the analyst to access to the trace data that is associated with the received serial number and the user information when the analysis requirement is received.

13. A non-transitory computer-readable information storage medium having stored thereon a program for causing a computer to:
  acquire, from a user terminal configured to transmit trace data relating to motor control of at least one motor that is controlled by a motor controller to the computer, the trace data via a network;

record the acquired trace data associated with a serial number of the motor controller and user information of a user who performs an upload operation in the computer;
prohibit an analyst who operates an analyst terminal from accessing to the trace data;
receive an analysis requirement of the trace data with the serial number and the user information from the user terminal; and
permit the analyst to access to the trace data that is associated with the received serial number and the user information when the analysis requirement is received.

* * * * *